United States Patent
Andre et al.

(10) Patent No.: US 9,741,673 B2
(45) Date of Patent: Aug. 22, 2017

(54) RF TRANSISTOR PACKAGES WITH HIGH FREQUENCY STABILIZATION FEATURES AND METHODS OF FORMING RF TRANSISTOR PACKAGES WITH HIGH FREQUENCY STABILIZATION FEATURES

(75) Inventors: Ulf Hakan Andre, Hillsborough, NC (US); Simon Maurice Wood, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/537,933

(22) Filed: Jun. 29, 2012

(65) Prior Publication Data
US 2013/0015924 A1    Jan. 17, 2013

Related U.S. Application Data

(63) Continuation-in-part of application No. 11/767,172, filed on Jun. 22, 2007, now Pat. No. 8,330,265.

(51) Int. Cl.
*H01L 23/66* (2006.01)
*H01L 23/64* (2006.01)
(Continued)

(52) U.S. Cl.
CPC .............. *H01L 23/66* (2013.01); *H01G 5/18* (2013.01); *H01G 5/38* (2013.01); *H01L 23/642* (2013.01); *H01L 24/48* (2013.01); *H01L 24/49* (2013.01); *H01L 2223/6655* (2013.01); *H01L 2224/48091* (2013.01); *H01L 2224/48195* (2013.01); *H01L 2224/49175* (2013.01); *H01L 2924/00014* (2013.01); *H01L 2924/01006* (2013.01);
(Continued)

(58) Field of Classification Search
CPC ................................ H01L 28/00; H01L 28/40
USPC ............ 257/691, 690, 724; 438/106; 333/32
See application file for complete search history.

(56) References Cited

U.S. PATENT DOCUMENTS 3,593,107 A * 7/1971 Chilton et al. .................. 363/61
6,177,834 B1 * 1/2001 Blair et al. ..................... 327/566
(Continued)

FOREIGN PATENT DOCUMENTS

EP    1 058 312 A2    12/2000

OTHER PUBLICATIONS

Notification of Transmittal of the International Search Report and the Written Opinion of the International Searching Authority, or the Declaration, PCT/US2013/046298, Date of Mailing: Dec. 2, 2013, 12 pages.
(Continued)

*Primary Examiner* — Yu-Hsi D Sun
(74) *Attorney, Agent, or Firm* — Myers Bigel, P.A.

(57) ABSTRACT

A packaged RF transistor device includes an RF transistor die including a plurality of RF transistor cells, an RF input lead coupled to the plurality of RF transistor cells, an RF output lead, and an output matching network coupled between the plurality of RF transistor cells and the RF output lead. The output matching network includes a plurality of capacitors having respective upper capacitor plates, wherein the upper capacitor plates of the capacitors are coupled to output terminals of respective ones of the RF transistor cells. The plurality of capacitors may be provided as a capacitor block that includes a common reference capacitor plate and a dielectric layer on the reference capacitor plate. The upper capacitor plates may be on the dielectric layer.

24 Claims, 12 Drawing Sheets

(51) Int. Cl.
   *H01G 5/18* (2006.01)
   *H01G 5/38* (2006.01)
   *H01L 23/00* (2006.01)
(52) U.S. Cl.
   CPC ............... *H01L 2924/01014* (2013.01); *H01L 2924/01023* (2013.01); *H01L 2924/01029* (2013.01); *H01L 2924/01074* (2013.01); *H01L 2924/01075* (2013.01); *H01L 2924/01082* (2013.01); *H01L 2924/10329* (2013.01); *H01L 2924/1305* (2013.01); *H01L 2924/13063* (2013.01); *H01L 2924/13091* (2013.01); *H01L 2924/19041* (2013.01); *H01L 2924/3011* (2013.01); *H01L 2924/30105* (2013.01); *H01L 2924/30107* (2013.01); *H01L 2924/30111* (2013.01)

(56) References Cited

U.S. PATENT DOCUMENTS

| | | |
|---|---|---|
| 7,015,527 B2 | 3/2006 | Yang et al. |
| 7,154,735 B2 | 12/2006 | Matters-Kammerer |
| 7,372,334 B2 * | 5/2008 | Blair ....................... H01L 23/66 330/302 |
| 8,594,594 B2 * | 11/2013 | Leong ........................ 455/127.1 |
| 2006/0007632 A1 | 1/2006 | Matters-Kammerer |
| 2008/0315393 A1 | 12/2008 | Farrell et al. |
| 2011/0074006 A1 * | 3/2011 | Wood .................... H01L 23/642 257/691 |

OTHER PUBLICATIONS

Notification of Transmittal of the International Preliminary Report on Patentability, PCT/US2013/046298, Date of Mailing: Jan. 8, 2015, 10 pages.

Extended European Search Report for corresponding European Application No. 13809475.0, Date of Mailing: Mar. 18, 2016, 6 pages.

Chinese Office Action Corresponding to Chinese Patent Application No. 201380034101.4; Date of Notification: May 25, 2016; Foreign Text, 17 Pages, English Translation Thereof, 8 Pages.

* cited by examiner

RF TRANSISTOR PACKAGES WITH HIGH FREQUENCY STABILIZATION FEATURES AND METHODS OF FORMING RF TRANSISTOR PACKAGES WITH HIGH FREQUENCY STABILIZATION FEATURES

RELATED APPLICATION

The present application is a continuation-in-part of U.S. patent application Ser. No. 11/767,172, filed Jun. 22, 2007 now U.S. Pat. No. 8,330,265, entitled "RF Transistor Packages With Internal Stability Network And Methods Of Forming RF Transistor Packages With Internal Stability Networks," the disclosure of which is hereby incorporated herein by reference in its entirety.

FIELD

This invention relates generally to RF transistors, and more particularly the invention relates to packaged RF transistors having matching networks, and methods of forming packaged RF transistors having matching networks.

BACKGROUND

Packaged RF power devices typically include a transistor die mounted on a base and enclosed in a package. An RF input signal is supplied to the transistor through an RF input lead that extends from outside the package to the inside of the package, and an RF output signal is delivered from the device through an RF output lead that extends from inside the package to the outside. An input matching circuit can be included within the package, and can be connected between the RF input lead and an input terminal of the RF transistor. The input matching circuit provides an impedance match at the input of the transistor at the fundamental operating frequency of the transistor.

SUMMARY

A packaged RF transistor device according to some embodiments includes an RF transistor die including a plurality of RF transistor cells, an RF input lead coupled to the plurality of RF transistor cells, an RF output lead, and an output matching network coupled between the plurality of RF transistor cells and the RF output lead. The output matching network includes a plurality of capacitors having respective upper capacitor plates, wherein the upper capacitor plates of the capacitors are coupled to output terminals of respective ones of the RF transistor cells.

The packaged RF transistor device may further include a combiner coupled to the RF output lead, wherein the output matching network further includes first wire bonds between respective ones of the RF transistor cells and the upper capacitor plates of respective ones of the capacitors, and second wire bonds between the upper capacitor plates of respective ones of the capacitors and the combiner.

The packaged RF transistor device may further include a package that houses the RF transistor die and the output matching network, with the RF input lead and the RF output lead extending from the package.

The packaged RF transistor device may further include a base with the RF transistor die mounted on the base between the RF input lead and the RF output lead. The plurality of capacitors may be provided as a capacitor block on the base between the RF transistor die and the RF output lead.

The capacitor block may include a common reference capacitor plate and a dielectric layer on the reference capacitor plate, with the upper capacitor plates on the dielectric layer.

Adjacent ones of the upper capacitor plates may be coupled together by electrically conductive connectors.

The electrically conductive connectors may include metal strips on the dielectric layer that contact adjacent ones of the upper capacitor plates. The metal strips may have widths that are smaller than widths needed to support a resonance mode in the dielectric layer.

The upper capacitor plates may be arranged in a first direction, and the metal strips may have widths in a second direction that is transverse to the first direction that are at least five times smaller than a length of the capacitor block in the first direction.

Adjacent ones of the upper capacitor plates may be coupled together by electrically resistive connectors. The electrically resistive connectors may have resistivities greater than 1E-5 ohm-cm and in some embodiments greater than about 1E-4 ohm-cm.

The plurality of capacitors may include a plurality of discrete devices including separate reference capacitor plates and separate dielectric layers.

The packaged RF transistor device may further include an input matching network coupled between the RF input lead and the plurality of RF transistor cells. The input matching network may include a plurality of second capacitors having respective second upper capacitor plates, and the second upper capacitor plates of the second capacitors may be coupled to the input terminals of respective ones of the RF transistor cells.

The plurality of second capacitors may be provided as a capacitor block including a common reference capacitor plate and a dielectric layer on the reference capacitor plate. The second upper capacitor plates may be on the dielectric layer.

A packaged RF transistor device according to further embodiments includes an RF transistor die including a plurality of RF transistor cells, an RF input lead coupled to respective ones of the RF transistor cells, an RF output lead, and an output matching network coupled between the RF transistor die and the RF output lead. The output matching network includes a split capacitor including a reference capacitor plate, a dielectric layer on the reference capacitor plate, and a plurality of upper capacitor plates on the dielectric layer. The upper capacitor plates of the split capacitor are coupled to the output terminals of respective ones of the RF transistor cells.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1:
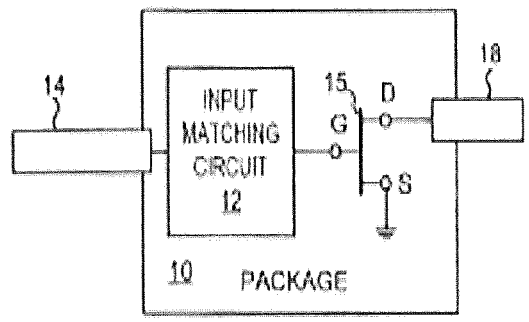
FIG. 1 is a functional block diagram of a conventional RF power transistor.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

An RF transistor can include a large periphery transistor die that includes a number of discrete transistor cells on a common substrate and connected in parallel. Input and/or output matching can be particularly beneficial for such devices, as it can increase the usable bandwidth of the devices. However, a matching network typically includes a single capacitor, which can create a lower frequency feedback path between adjacent cells of the large periphery transistor die. This feedback path can reduce the stability of the overall device.

Furthermore, the impedance values of elements of the matching networks may need to be carefully selected to reduce the creation of odd mode oscillations. Selection of the impedance values, including selection of appropriate inductances through bond wire lengths, can limit the topology of the matching network.

Some embodiments of the invention provide packaged RF power transistors. RF power transistors typically include a plurality of transistor cells operating in parallel. Transistors that can be included in packages according to embodiments of the invention can include laterally diffused MOSFETS (LDMOSFET) or other semiconductor devices, such as vertical MOSFETs, bipolar devices, MESFET devices, HBTs and HEMT devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

RF power transistors providing 10 watts or more of power can be packaged as discrete devices, as shown schematically at 10 in FIG. 1. The packaged transistor 15 (which may include a FET or bipolar device, for example) normally includes an input matching circuit 12 connecting an RF input lead 14 to a control electrode of the transistor 15 (e.g., a gate G of a FET or a base of a bipolar transistor). The transistor 15 may be a large periphery RF transistor including a plurality of transistor cells connected in parallel. An RF output lead 18 is connected to an output electrode of the transistor 15 (e.g., the drain D of a FET or the collector or emitter of a bipolar transistor). The RF input lead 14 and the RF output lead 18 extend outside the package 10, as shown in FIG. 1. The source S of the FET 15 may be grounded.

A packaged transistor 10 may be mounted on a printed circuit board (not shown). An external output matching circuit (not shown) may also be mounted on the printed circuit board. A bias/RF diplexer (not shown) may be connected to the external output matching circuit to connect the transistor output to an RF output. Furthermore, a DC power supply (not shown) may be connected to the transistor's RF output lead 18.

Internal matching networks have been provided within RF power transistor packages, as illustrated in FIG. 1. However, such internal matching networks typically include a single capacitor. As explained above, including the capacitor within the device package can create a lower frequency feedback path between adjacent cells of a large periphery transistor die, which can reduce the stability of the overall device.

According to some embodiments of the invention, an internal matching network of a packaged RF transistor includes a plurality of parallel capacitors. Wirebond connections are provided from the plurality of the capacitors to respective cells of a multi-cell RF transistor die.

For example, an internal matching network can include a split capacitor and/or multiple capacitors on the base of the package adjacent the multi-cell RF transistor die. Providing an input matching network including a plurality of parallel capacitors can reduce and/or remove the low frequency feedback path(s), which can improve the stability of the packaged device.

Figure 2A:
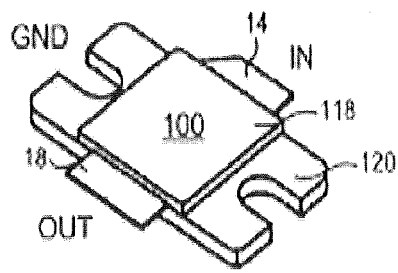
FIG. 2A is a perspective view of a packaged RF power transistor according to some embodiments of the invention.
Figure 2B:
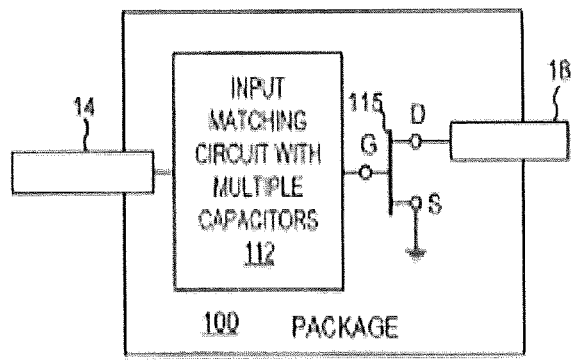
FIG. 2B is a functional block diagram of a packaged RF power transistor according to some embodiments of the invention.

A packaged RF transistor 100 according to some embodiments of the invention is shown generally in FIG. 2A and schematically in FIG. 2B. As shown therein, the packaged transistor 100 includes a housing 118 mounted on a metal flange 120. An RF input lead 14 and an RF output lead 18 that extend outside the package. The RF input lead 14 is connected through an input matching circuit 112 to a control terminal (such as the gate G) of a transistor array 115, which can include a plurality of transistor cells connected in parallel. An output terminal (such as the drain D) of the transistor array 115 is connected to the RF output lead 18. According to some embodiments, the input matching circuit includes multiple capacitors. Respective ones of the capacitors in the input matching circuit may be coupled to a respective transistor cell of the RF transistor array 115.

Figure 3:
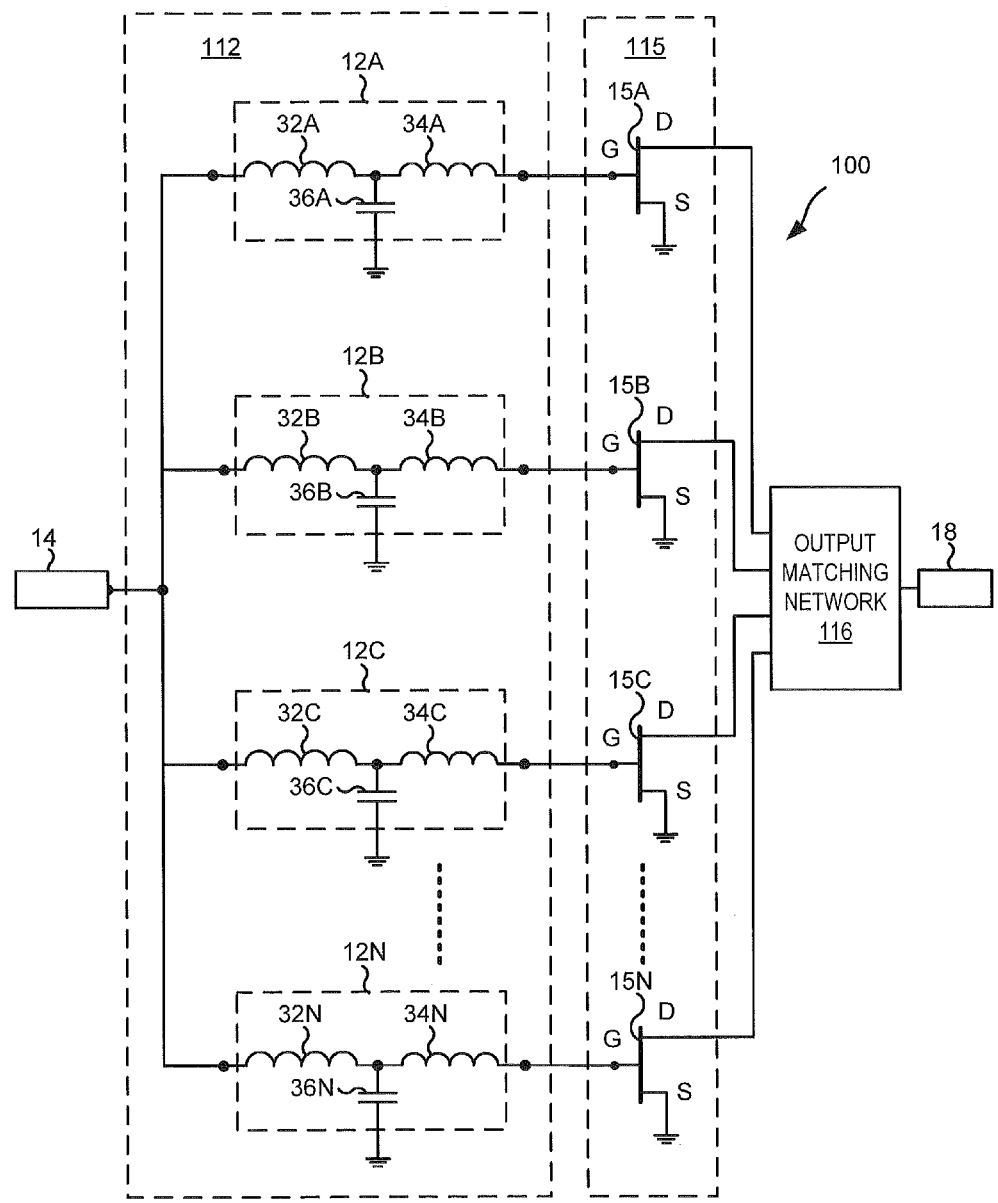
FIG. 3 is a schematic circuit diagram of a packaged RF power transistor according to some embodiments of the invention.
Figure 4:
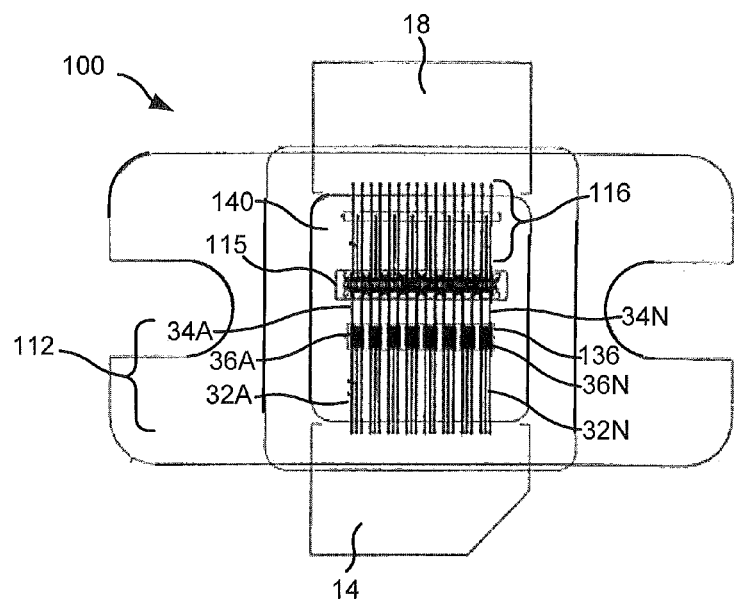
FIG. 4 is a plan view of a layout of a packaged RF power transistor according to some embodiments of the invention.

A schematic circuit diagram for a package 100 including an RF power transistor array 115 and an input matching network 112 according to embodiments of the invention is illustrated in FIG. 3, and a physical layout of a package 100 according to embodiments of the invention is illustrated in FIG. 4. Referring to FIGS. 3 and 4, a package 100 includes an RF transistor array 115 including a plurality of parallel transistor cells 15A-N. Although FIG. 3 illustrates an RF transistor array 115 including four parallel cells 15A, 15B, 15C and 15N, it will be appreciated that the RF transistor array 115 can have more than four, or less than four, parallel cells, according to embodiments of the invention. Each of the transistor cells 15A-N includes a control or input terminal and an output terminal. For example, in embodiments including a FET device, each of the transistor cells includes a gate G, a drain D and a source S. In some embodiments, the gate G corresponds to the control or input terminal and the drain D corresponds to the output terminal, while the source S is grounded, as shown in FIG. 3.

Each transistor cell 15A-N may be on a separate die, or multiple cells can be on a single die. Thus, the term "cell" can encompass more than a single gate/source arrangement. A transistor array 115 can further include multiple die, each of which includes one or more transistor cells. Each transistor cell may be connected to a respective input matching circuit and/or output matching circuit, as discussed in more detail below.

An input matching network 112 is connected between an RF signal input lead 14 and gates G of the transistor cells 15A-N. The input matching circuit 112 may include a plurality of inductive wire bond connections including bond wires extending between the RF signal input lead 14 and a capacitor block 136, and inductive wire bond connections including bond wires extending from the capacitor block 136 to the gates of the transistor cells 15A-N.

The input matching network 112 includes a plurality of input matching circuits 12A to 12N, each of which is connected between the RF signal input lead 14 and a respective cell 15A-N of the RF transistor array 115. Each of the input matching networks 12A-N includes a first inductance 32A-N, a second inductance 34A-N and a capacitor 36A-N. The input matching networks shown in FIG. 3 are provided as examples; other inductances and/or impedances could be included in the input matching networks 12A-N. As illustrated in FIG. 4, the first inductance 32A-N can be provided by a wire bond connection between the RF input lead 14 and a terminal of a corresponding capacitor 36A-N. The second inductance 34A-N can be provided by a wire bond connection between the terminal of the corresponding capacitor 36A-N and an input terminal of a corresponding cell 15A-N of the RF transistor array 115.

Figure 5:
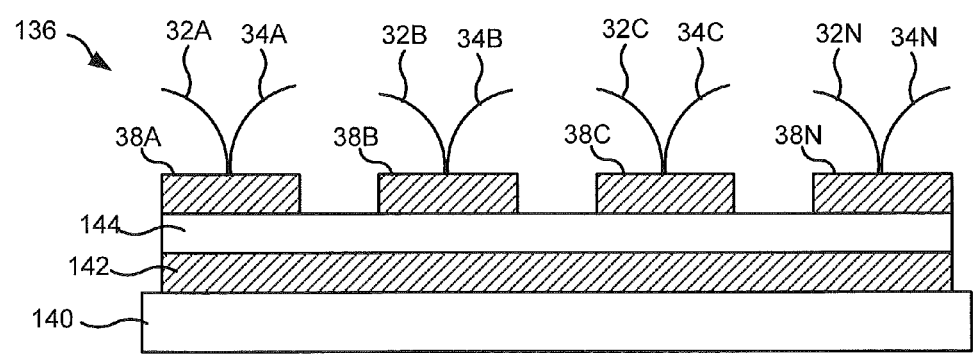
FIG. 5 is a cross sectional view of a split capacitor in accordance with some embodiments of the invention.

The capacitors 36A-N of the input matching network can be provided in a capacitor block 136 that can include discrete capacitor devices and/or can include a split capacitor, as illustrated in FIG. 5. Referring to FIG. 5, the capacitor block 136 can include a split capacitor including a plurality of discrete upper capacitor plates 38A to 38N provided on a common dielectric 144 and a common reference capacitor plate 142 on the base 140, as illustrated in FIGS. 4 and 5. It will be appreciated that the term "upper" is used herein in a relative manner assuming that the reference capacitor plate is positioned below the upper capacitor plates. However, in some embodiments, the capacitor block may be arranged so that the reference capacitor plate is physically arranged above the upper capacitor plates.

The wire bonds 32A-N connecting the RF input lead 14 to the upper capacitor plates 38A-N and the wire bonds 34A-N connecting the upper capacitor plates 38A-N to the input terminals of the respective transistor cells 15A-N are also partially illustrated in FIG. 5.

The capacitance of a parallel plate capacitor is given by the following formula:

$$C = \varepsilon_r \varepsilon_0 \frac{A}{d} \quad [1]$$

where C is the capacitance, A is the area of overlap of the two plates, $\varepsilon_r$ is the dielectric constant of the material between the plates, $\varepsilon_0$ is the electric constant ($\varepsilon_0 \approx 8.854 \times 10^{-12}$ F m$^{-1}$), and d is the separation between the plates. Accordingly, for a common dielectric 144 having a given material and thickness, the capacitance of the respective capacitors 36A-N is determined by the area of the upper capacitor plates 38A-N. The capacitance of the capacitors 36A-N can therefore be set on an individual basis to obtain a desired result.

In the embodiments illustrated in FIGS. 3 and 4, the output terminals of the transistor cells 15A to 15N are connected to the RF output lead 18 through an output matching network 116.

As shown in FIG. 4, the capacitor block 136 can be mounted on the base 140 of the package 100 adjacent to the transistor 15. It will be appreciated that the base of the package 100 can refer to any structural member on which the transistor 15 is mounted, and accordingly can correspond to a substrate, flange, die carrier, or the like.

While embodiments of the present application have been described primarily in connection with an input matching circuit, embodiments of the invention may be used in an output matching circuit, such as the output matching circuit 116 illustrated in FIGS. 3 and 4. For example, a capacitor block 136 including a split capacitor as shown in FIG. 5 could be provided in the output matching circuit 116 according to some embodiments. In such embodiments, an output terminal (e.g., the drain D) of each of the transistor cells 15A-N may be coupled to a corresponding upper capacitor plate 38A-N of a capacitor of the capacitor block 136, for example via an inductive bond wire. The upper capacitor plates 38A-N may likewise be coupled to the RF output lead 18, for example via an inductive bond wire. The lengths of the inductive bond wires and the capacitance of the capacitors in the capacitor block 136 may be chosen to provide a suitable impedance match at the output of the transistor die 115.

Figure 6A:
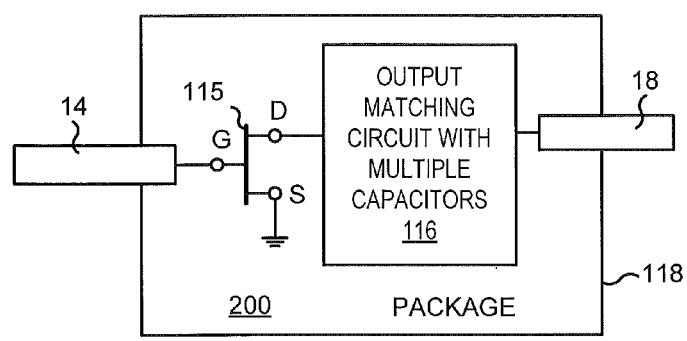
FIGS. 6A and 6B are functional block diagrams of packaged RF power transistors according to further embodiments of the invention.
Figure 6B:
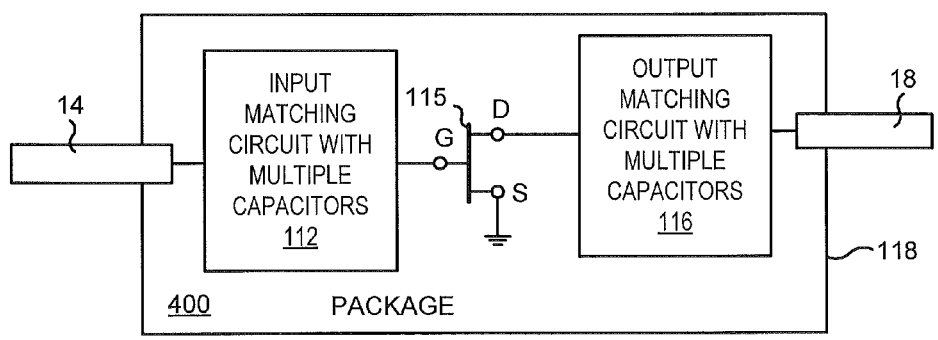

For example, FIG. 6A is a functional block diagram of a packaged RF power transistor 200 according to some embodiments of the invention that includes an output matching circuit 116 that includes multiple capacitors. FIG. 6B is a functional block diagram of a packaged RF power transistor 400 according to further embodiments of the invention that includes both an input matching circuit 112 with multiple capacitors and an output matching circuit 116 with multiple capacitors. The packaged RF power transistor 200 includes an RF transistor array 115 provided in a package housing 118 along with the output matching circuit 116. An input lead 14 and an output lead 18 are coupled to the transistor array 115 and extend from the housing 118.

Figure 7A:
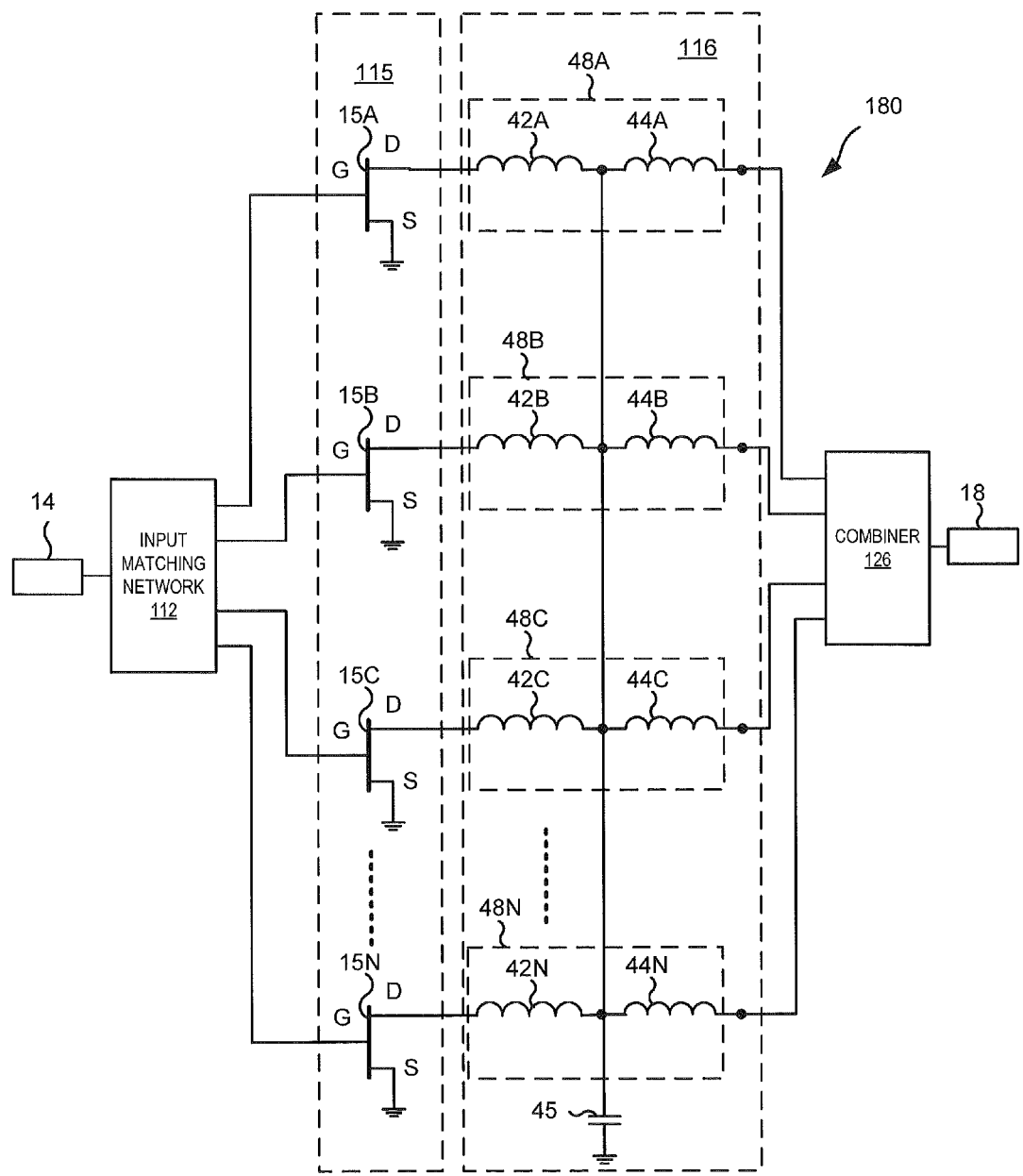
FIGS. 7A, 8A and 9A are schematic circuit diagrams of packaged RF power transistors according to further embodiments of the invention.

FIG. 7A is a schematic circuit diagram of a power amplifier circuit 180 including an output matching circuit 116 having a single output capacitor 45. The amplifier circuit 180 includes an input lead 14 coupled to an input matching network 112 that is coupled to the gate of each of a plurality of transistor cells 15A-15N of a transistor array 115. An output of each transistor cell 15A-N is coupled to a respective output matching circuit 48A-48N of an output matching network 116. Each cell 15A-15N may include a group of gate fingers that are connected to a single input. Each cell has a single input pad and a single output pad. Furthermore, gates of adjacent transistor cells 15A-15N may be connected with parallel resistors (not shown) for stabilization.

Each of the output matching circuits includes a first series inductance 42A-42N coupled between the transistor cells 15A-15N and a common capacitor 45, and a second series inductance 44A-44N coupled between the common capacitor 45 and an output combiner 126. The output of the combiner 126 is connected to the output lead 18. The output matching networks shown in FIG. 7A are provided as examples; other inductances and/or impedances could be included in the output matching networks 42A-42N.

Figure 7B:
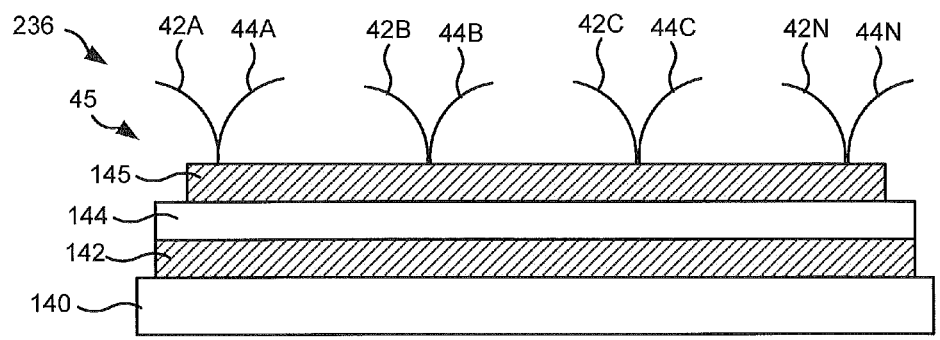
FIGS. 7B, 8B and 9B are cross sectional views of split capacitors in accordance with further embodiments of the invention.
Figure 7C:
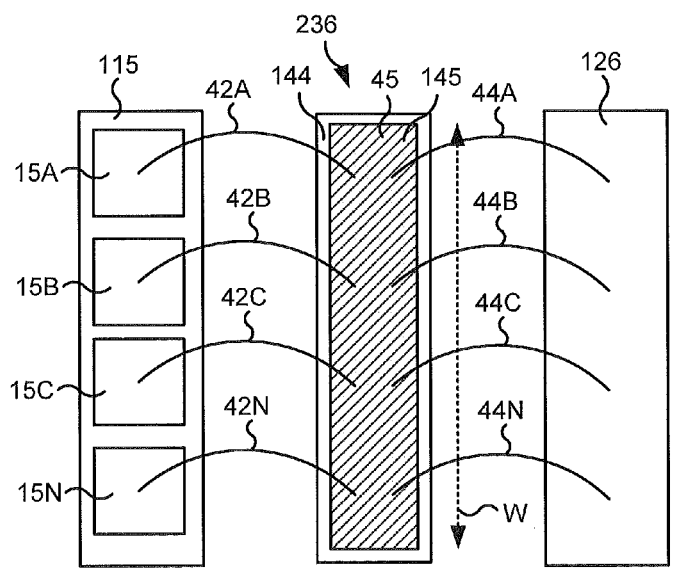
FIGS. 7C, 8C and 9C are plan views that illustrate portion of power amplifiers in accordance with further embodiments of the invention.

FIG. 7B is a cross-sectional view of a capacitor structure 236 that can be used to provide the common capacitor 45, and FIG. 7C is a plan view that illustrates portions of the power amplifier 180 including the transistor array 115, the common capacitor 45 and the combiner 126. Referring to FIG. 7B, the common capacitor may include a reference capacitor plate 142, a dielectric layer 144 and an upper capacitor plate 145 provided on a base 140. Wirebonds 42A-42N and 44A-44N provide the series inductances described above with respect to FIG. 7A.

Referring to FIG. 7B, the common capacitor is provided between the transistor array 115 and the output combiner 126. Wirebonds 42A-42N extend between the transistor cells 15A-15N and the common capacitor 45, while wirebonds 44A-44N extend between the common capacitor 45 and the output combiner 126.

A combined capacitor 45 is typically provided to enhance odd-mode stability. However, the use of a combined capacitor in the output matching network can lead to other stability issues in high performance (i.e. high frequency and/or high power) amplifiers. For example, one drawback to this configuration is that the width W of the common capacitor 45 may be greater than one half wavelength of the input signal. For this reason, undesirable resonance modes can exist in the dielectric layer 144 of the common capacitor 45. For example, it has been found that at low input voltages, self-oscillation can be induced in the amplifier circuit at resonant frequencies due, for example, to resonant paths through the common capacitor 45 between respective ones of the transistor cells 15A-15N. Such undesired resonances can cause stability problems in a high power RF amplifier.

A typical way to reduce such resonances is to include series resistances in one or more of the amplifier paths. However, such an approach can negatively affect the RF performance of the device.

Figure 8A:
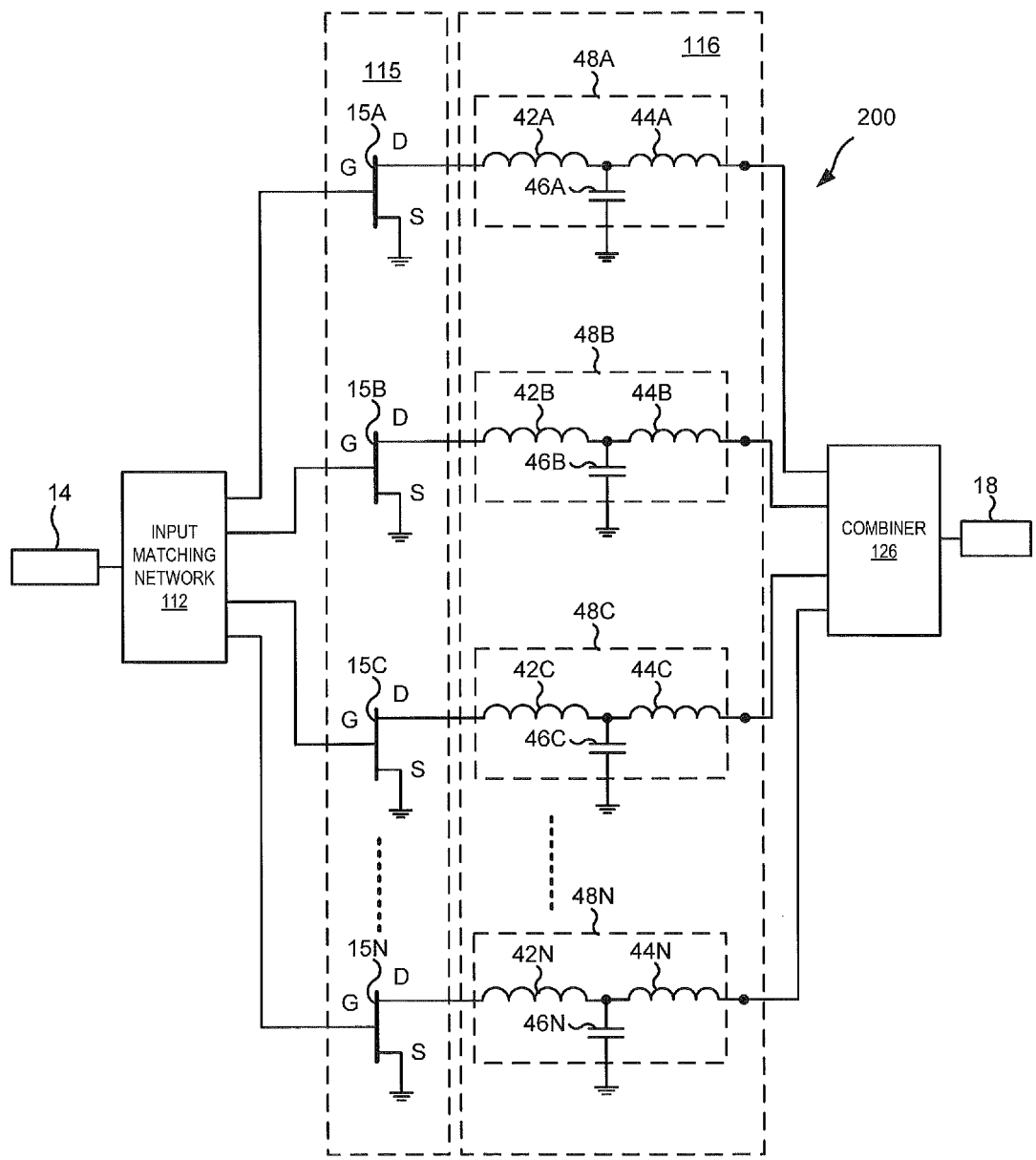

To reduce or prevent the occurrence of instability due to resonance in an output capacitor, some embodiments of the invention provide separate output capacitors for each of the transistor cells 15A-15N. For example, FIG. 8A is a schematic circuit diagram of a packaged amplifier 200 that includes separate output capacitors 46A-46N for the respective transistors 15A-15N. The amplifier 200 includes an output matching network 116 that includes separate output matching circuits 48A-48N for each of the transistor cells 15A-15N of a transistor array 115. A first terminal of each output capacitor 46A-46N is coupled to an output of a respective transistor cell 15A-15N by an inductance 42A-42N (which may be provided, for example, by a wirebond). The second terminal of each output capacitor 46A-46N is coupled to ground. The first terminal of each output capacitor 46A-46N is also coupled to a combiner 126 by a second inductance 44A-44N, which may also be provided by a wirebond.

Figure 8B:
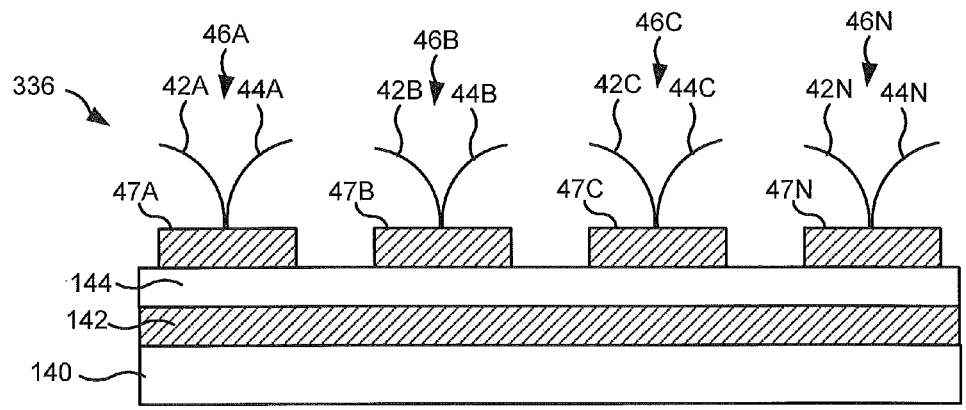
Figure 8C:
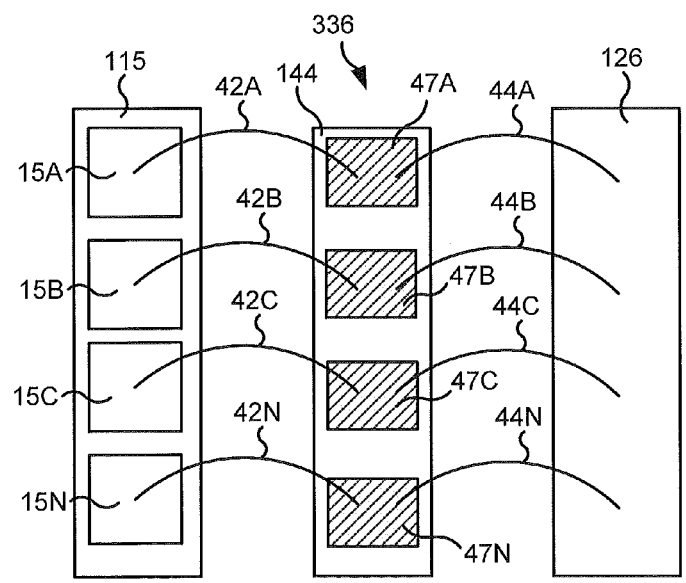

The output capacitors 46A-46N may be provided as a capacitor block 336, as illustrated in FIGS. 8B and 8C, of which FIG. 8B is a cross-sectional view and FIG. 8C is a plan view showing the placement of the capacitor block 336 between the transistor array 115 and the output combiner 126.

Referring to FIGS. 8B and 8C, the capacitor block 336 may include a reference capacitor plate 142 mounted on a base 140, a dielectric layer 144 on the reference capacitor plate 142, and a plurality of upper capacitor plates 47A-47N on the dielectric layer 144 that define the respective output capacitors 46A-46N. Each of the upper capacitor plates 47A-47N may be coupled to a respective transistor cell 15A-15N via wirebond connections 42A-42N. Likewise, each of the upper capacitor plates 47A-47N may be connected to the output combiner 126 via respective wirebonds 44A-44N.

The capacitance of the capacitors 46A-46N may be determined by the areas of the respective upper capacitor plates 47A-47N. Thus, the capacitance of each capacitor 46A-46N can be tuned to provide a desired output characteristic, such as to reduce or minimize unwanted resonances in the output signal.

Because the upper capacitor plates 47A-47N are separated from one another, the existence of resonance modes in the dielectric layer 144 may be reduced. However, separating the output capacitors may lead to the creation of other instabilities in the overall amplifier. As noted above, a combined capacitor is typically used to negate odd mode instability in power amplifiers. Such instabilities can potentially be addressed by properly selecting capacitances and/or inductances of the various components of the output matching circuit 116. However, such selection may be difficult and/or time-consuming.

Figure 9A:
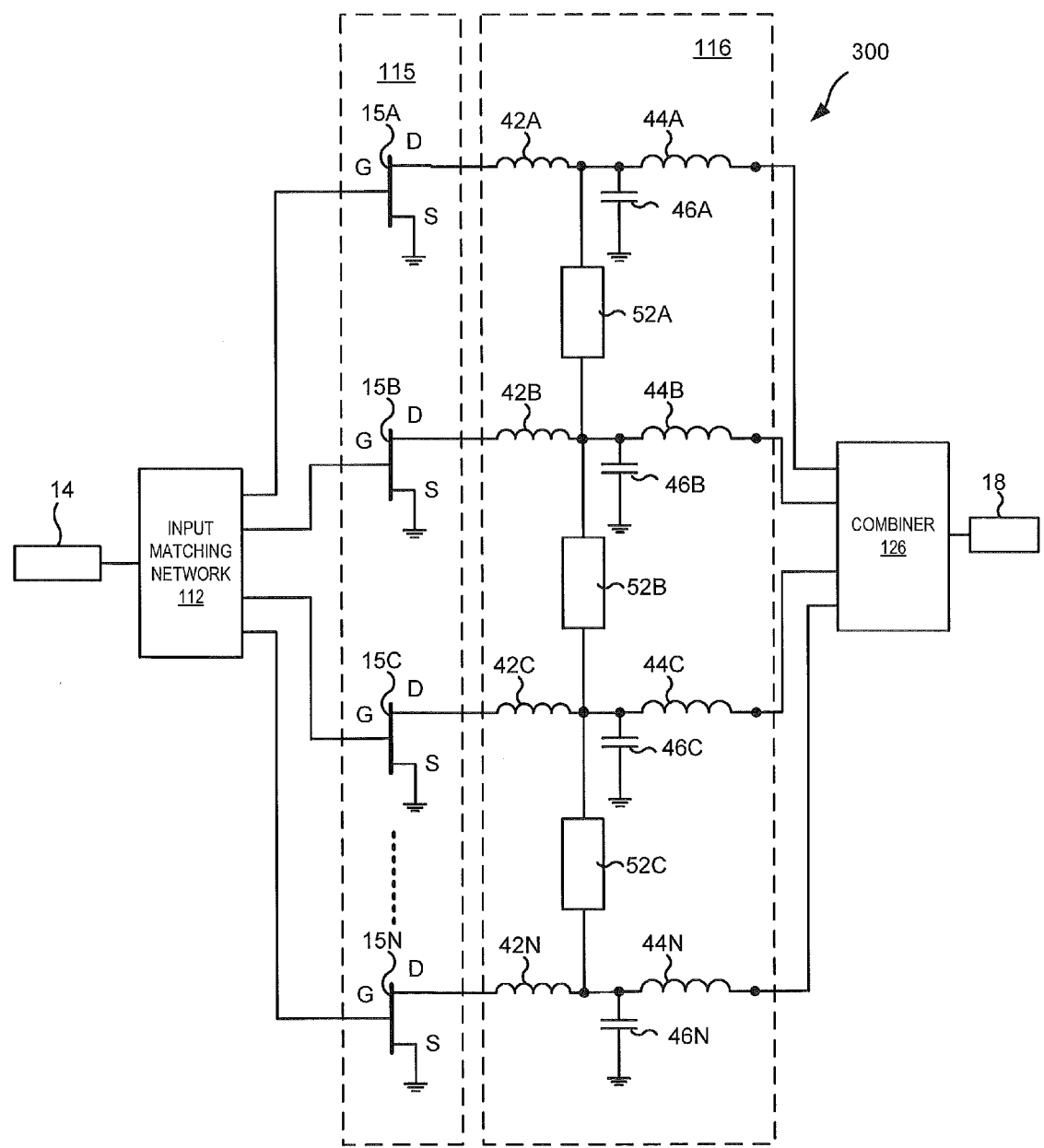
Figure 9B:
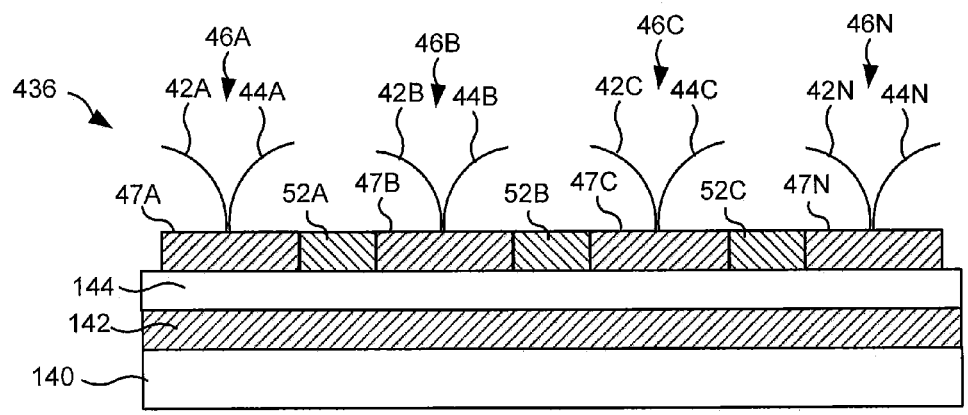
Figure 9C:
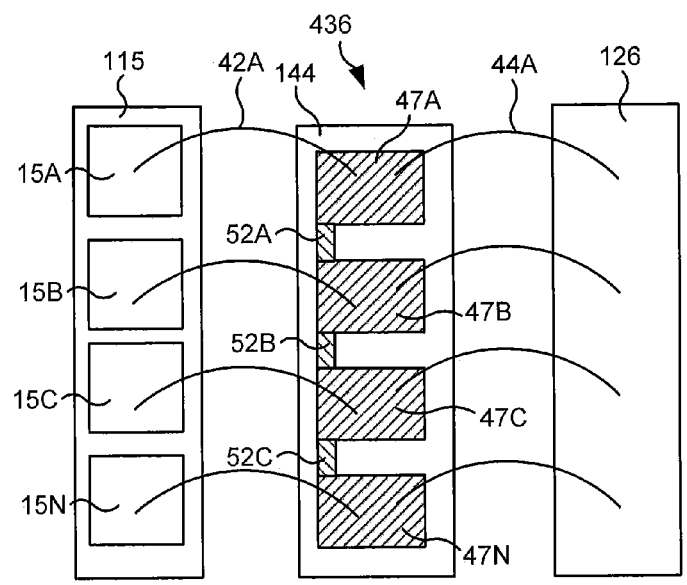

Some embodiments of the invention address this problem by connecting the upper capacitor plates with connection strips. For example, FIG. 9A is a schematic circuit diagram of a packaged amplifier 300 that includes a capacitor block 436 according to some embodiments. FIG. 9B is a cross-sectional view and FIG. 9C is a plan view showing the placement of the capacitor block 436 between the transistor array 115 and the output combiner 126. The capacitor block 436 includes separate output capacitors 46A-46N that are connected via electrically conductive members 52A-52C. The electrically conductive members 52A-52C may help to avoid odd mode instability but may be small enough that they do not support unwanted resonance modes in the dielectric layer 144.

As shown in FIG. 9C, the electrically conductive members 52A-52C may be formed as metallic connection strips directly on the dielectric layer 144. In some embodiments, the connection strips 52A-52C can be formed as metallic traces on the dielectric layer 144 using the same or similar metallization and patterning processes used to form the upper capacitor plates 47A-47N. Other configurations are possible, however. For example, the electrically conductive members 52A-52C could be formed using wirebonds, air-bridge connections, etc.

The dimensions of the connection strips 52A-52N may be kept small enough that they do not support transverse resonant modes in the dielectric layer 144 of the capacitor block 436. The physical dimensions (e.g., length and width) of the strips 52A-52C are chosen so the width of the strips 52A-52C (in the direction indicated by the arrow labeled WIDTH in FIG. 9C that is transverse to the direction in which the upper capacitor plates 47A-47N are arranged) is significantly smaller than the length of the capacitor 47 (in the direction indicated by the arrow labeled LENGTH in FIG. 9C that is parallel to the direction in which the upper capacitor plates 47A-47N are arranged). For example, the length of the capacitor 47 may be at least about 5 to 10 times the width of the strips 52A-52C. This may reduce or prevent the unwanted self resonance in the capacitor 47. The dimensions and/or resistance of the strips 52A-52C may be determined, for example, through simulation and stability analysis. The inductance or phase shift through the strip can provide the odd mode stability when chosen correctly.

In some embodiments the strips 52A-52C may be fabricated using a metal, such as aluminum or copper, with a very low resistivity, e.g., less than about 1E-5 ohm-cm. However, in other embodiments, the strips 52A-52C may be fabricated using a more resistive material, such as NiCr or TaN, which can have a resistivity greater than about 1E-4 ohm-cm. The use of resistive strips 52A-52C can help to achieve odd mode stability.

Figure 10:
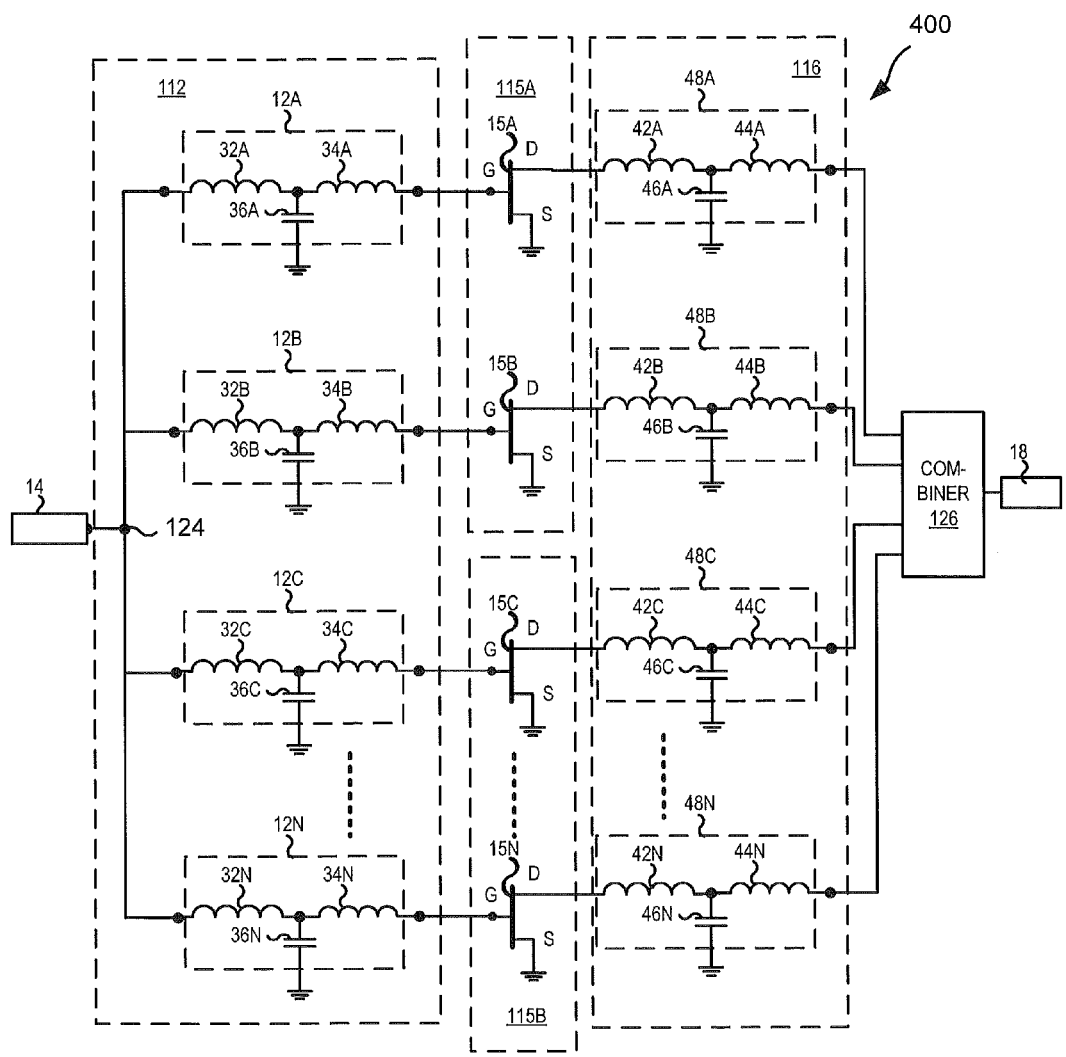
FIG. 10 is a schematic circuit diagram of a packaged RF power transistor according to further embodiments of the invention.
Figure 11:
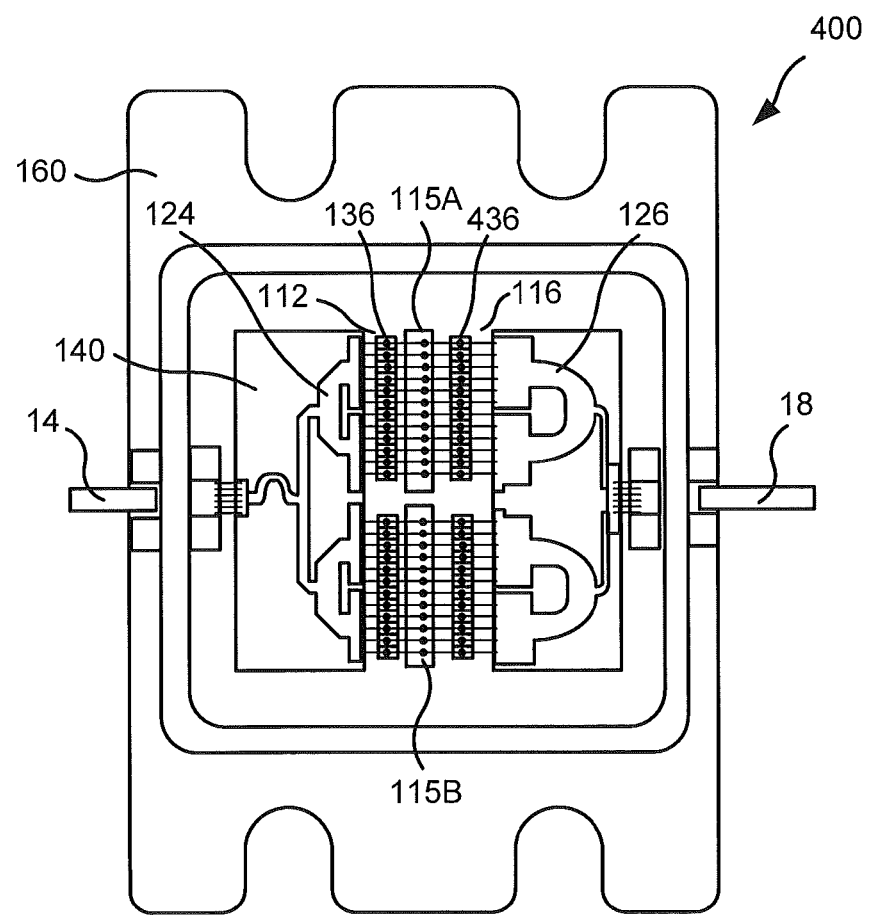
FIG. 11 is a plan view of a layout of a packaged RF power transistor according to further embodiments of the invention.

FIG. 10 is a schematic circuit diagram and FIG. 11 is a topological plan view of an amplifier 400 including both input and output matching networks 112, 116 that use separate capacitors. Although not illustrated in FIG. 13, the capacitors 46A-46N in the input matching network 112 and/or the output matching network 116 may be connected using connection strips 52A-C as discussed above.

Referring to FIGS. 10 and 11, the amplifier 400 includes two transistor die 115A, 115B, each of which includes multiple transistor cells, mounted on a base 140 that is in turn mounted on a metal flange 160. An input lead 14 is coupled to a splitter 124 that splits an input signal and feeds it to a split capacitor block 136 of an input matching network 112 via wirebond connections 32A-32N. The respective input capacitors 36A-36N in the capacitor block 136 are coupled to gates of the respective transistor cells 15A-15N via wirebond connections 34A-34N.

Outputs of the respective transistor cells 15A-15N are coupled to capacitors 46A-46N of a split capacitor block 436 via wirebond connectors 42A-42N. The capacitors 46A-46N may be coupled together with connection strips as discussed above.

The capacitors 46A-46N are coupled to an output combiner 126 via wirebond connectors 44A-44N. An output of the combiner 126 is coupled to an output lead 18.

While embodiments of the present application have been described primarily in connection with packaged RF transistors including a single transistor die, multiple transistor dies 115 could be included in a single package 100, with a capacitor block 136 including multiple capacitors provided for one or more of the transistor dies, according to some embodiments of the invention.

A packaged RF power transistor according to embodiments of the invention may be useful in a wide range of applications in which stability is important. For example, a packaged power transistor according to embodiments of the invention may have application in systems, such as WiMAX, WCDMA, CDMA, and/or other systems, including future (4th generation) systems. In general, embodiments of the invention may be useful in any application in which stable operation is desired from a power transistor.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged RF transistor device, comprising:
   an RF transistor die including a plurality of RF transistor cells, each of the plurality of RF transistor cells including a control terminal and an output terminal;
   an RF input lead coupled to the plurality of RF transistor cells;
   an RF output lead;
   an output matching network coupled between the plurality of RF transistor cells and the RF output lead, the output matching network including a plurality of capacitors having respective upper capacitor plates, wherein the upper capacitor plates of the capacitors are coupled to the output terminals of respective ones of the RF transistor cells with first wire bonds; and
   a combiner that is coupled to the RF output lead,
   wherein the output matching network further comprises second wire bonds between the upper capacitor plates of respective ones of the capacitors and the combiner, and
   wherein the upper capacitor plates of respective ones of the capacitors are coupled between the first wire bonds and the second wire bonds.

2. The packaged RF transistor device of claim 1, further comprising a package that houses the RF transistor die and the output matching network, with the RF input lead and the RF output lead extending from the package.

3. The packaged RF transistor device of claim 2, further comprising a base, wherein the RF transistor die is mounted on the base between the RF input lead and the RF output lead, and wherein the plurality of capacitors is provided as a capacitor block on the base between the RF transistor die and the RF output lead.

4. The packaged RF transistor device of claim 3, wherein the capacitor block comprises a common reference capacitor plate and a dielectric layer on the reference capacitor plate, wherein the upper capacitor plates are on the dielectric layer.

5. The packaged RF transistor device of claim 4, wherein adjacent ones of the upper capacitor plates are coupled together by electrically conductive connectors.

6. The packaged RF transistor device of claim 5, wherein the electrically conductive connectors comprise metal strips on the dielectric layer that contact adjacent ones of the upper capacitor plates.

7. The packaged RF transistor device of claim 6, wherein the metal strips have widths that are smaller than widths needed to support a resonance mode in the dielectric layer.

8. The packaged RF transistor device of claim 6, wherein the upper capacitor plates are arranged in a first direction, and wherein the metal strips have widths in a second direction that is transverse to the first direction that are at least five times smaller than a length of the capacitor block in the first direction.

9. The packaged RF transistor device of claim 1, wherein adjacent ones of the upper capacitor plates are coupled together by electrically resistive conductors, and
wherein the conductors have resistivities greater than 1E-5 ohm-cm.

10. The packaged RF transistor device of claim 9, wherein the conductors have resistivities greater than about 1E-4 ohm-cm.

11. The packaged RF transistor device of claim 1, wherein the plurality of capacitors comprise a plurality of discrete devices including separate reference capacitor plates and separate dielectric layers.

12. The packaged RF transistor device of claim 1, further comprising:
an input matching network coupled between the RF input lead and the plurality of RE transistor cells, the input matching network including a plurality of second capacitors having respective second upper capacitor plates, wherein the second upper capacitor plates of the second capacitors are coupled to input terminals of respective ones of the RF transistor cells.

13. The packaged RF transistor device of claim 12, wherein the plurality of second capacitors is provided as a capacitor block including a common reference capacitor plate and a dielectric layer on the reference capacitor plate, wherein the second upper capacitor plates are on the dielectric layer.

14. A packaged RF transistor device, comprising:
an RF transistor die including a plurality of RF transistor cells, each of the plurality of RF transistor cells including a control terminal and an output terminal;
an RF input lead coupled to respective ones of the RF transistor cells;
an RF output lead;
an output matching network coupled between the RF transistor die and the RF output lead, the output matching network including a split capacitor including a reference capacitor plate, a dielectric layer on the reference capacitor plate, and a plurality of upper capacitor plates on the dielectric layer; and
a combiner that is coupled to the RF output lead,
wherein the upper capacitor plates of the split capacitor are coupled to the output terminals of respective ones of the RF transistor cells by first wire bonds, and
wherein the output matching network further comprises second wire bonds between the upper capacitor plates of respective ones of the capacitors and the combiner, and
wherein the upper capacitor plates of the split capacitor are coupled between the first wire bonds and the second wire bonds.

15. The packaged RF transistor device of claim 14, further comprising a package that houses the RF transistor die and the input matching network, with the RF input lead and the RF output lead extending from the package.

16. The packaged RF transistor device of claim 14, further comprising a base, wherein the RF transistor die is mounted on the base between the RF input lead and the RF output lead, and wherein the split capacitor is on the base between the RF transistor die and the RF output lead.

17. The packaged RF transistor device of claim 14, wherein adjacent ones of the upper capacitor plates are coupled together by electrically resistive conductors, and
wherein the conductors have resistivities greater than about 1E-4 ohm-cm.

18. The packaged RF transistor device of claim 14, wherein the plurality of capacitors comprise a plurality of discrete devices including separate reference capacitor plates and separate dielectric layers.

19. The packaged RF transistor device of claim 14, further comprising:
an input matching network coupled between the RF input lead and the plurality of RF transistor cells, the input matching network including a plurality of second capacitors having respective second upper capacitor plates, wherein the second upper capacitor plates of the second capacitors are coupled to input terminals of respective ones of the RF transistor cells.

20. The packaged RF transistor device of claim 19, wherein the plurality of second capacitors is provided as a capacitor block including a common reference capacitor plate and a dielectric layer on the reference capacitor plate, wherein the second upper capacitor plates are on the dielectric layer.

21. The packaged RF transistor device of claim 14, wherein adjacent ones of the upper capacitor plates are coupled together by electrically conductive connectors.

22. The packaged RF transistor device of claim 21, wherein the electrically conductive connectors comprise metal strips on the dielectric layer that contact adjacent ones of the upper capacitor plates.

23. The packaged RF transistor device of claim 22, wherein the metal strips have widths that are smaller than widths needed to support a resonance mode in the dielectric layer.

24. The packaged RF transistor device of claim 22, wherein the upper capacitor plates are arranged in a first direction, and wherein the metal strips have widths in a second direction that is transverse to the first direction that are at least five times smaller than a length of the capacitor block in the first direction.

* * * * *

UNITED STATES PATENT AND TRADEMARK OFFICE
CERTIFICATE OF CORRECTION

PATENT NO.         : 9,741,673 B2
APPLICATION NO.    : 13/537933
DATED              : August 22, 2017
INVENTOR(S)        : Andre et al.

It is certified that error appears in the above-identified patent and that said Letters Patent is hereby corrected as shown below:

In the Claims

Column 11, Claim 12, Line 42: Please correct "RE transistor cells" to read -- RF transistor cells --

Signed and Sealed this
Sixth Day of February, 2018

Joseph Matal
*Performing the Functions and Duties of the
Under Secretary of Commerce for Intellectual Property and
Director of the United States Patent and Trademark Office*